(12) United States Patent
Berg et al.

(10) Patent No.: US 6,357,098 B1
(45) Date of Patent: Mar. 19, 2002

(54) METHODS AND DEVICES FOR POSITIONING AND BONDING ELEMENTS TO SUBSTRATES

(75) Inventors: John Berg, Bellingham; David Kindler, Concord; David Kent, Framingham; David Buswell, Townsend, all of MA (US)

(73) Assignee: Terastor Corporation, San Jose, CA (US)

( * ) Notice: Subject to any disclaimer, the term of this patent is extended or adjusted under 35 U.S.C. 154(b) by 0 days.

(21) Appl. No.: 09/453,644

(22) Filed: Dec. 3, 1999

Related U.S. Application Data

(60) Provisional application No. 60/110,949, filed on Dec. 4, 1998, and provisional application No. 60/124,109, filed on Mar. 12, 1999.

(51) Int. Cl.⁷ .............................................. B25B 27/14
(52) U.S. Cl. ..................................................... 29/281.4
(58) Field of Search ............................. 29/281.4, 281.5, 29/281.1, 283; 269/903, 266, 296, 309; 228/49.1, 44.3

(56) References Cited

U.S. PATENT DOCUMENTS 5,152,707 A * 10/1992 Dougherty .................. 269/266

* cited by examiner

*Primary Examiner*—Robert C. Watson
(74) *Attorney, Agent, or Firm*—Fich & Richardson P.C.

(57) ABSTRACT

Devices and techniques for placing and bonding identical elements to holes in a substrate where spacer balls and a reference surface are used to achieve the desired accuracy.

21 Claims, 5 Drawing Sheets

US 6,357,098 B1

METHODS AND DEVICES FOR POSITIONING AND BONDING ELEMENTS TO SUBSTRATES

This application claims the benefits of U.S. Provisional Application Nos. 60/110,949, filed Dec. 4, 1998, and 60/124,109, filed Mar. 12, 1999.

BACKGROUND

The present disclosure generally relates to substrate processing, and more particularly, to methods and devices for positioning and bonding elements to substrate.

Manufacture of certain wafer-based devices often requires placing a component (e.g., a sphere) into an opening (e.g., a hole) in a substrate at a specified position. For example, an integrated optical device can include a lens, a conductor layer, and other components formed in a substrate. Such a device can be manufactured by fabricating multiple devices on a single substrate through multiple steps of wafer processing and then dicing the processed substrate into separate devices.

More specifically, one type of an optical head for an optical data storage system requires formation of a solid immersion lens having a spherical surface and a flat surface in a slider. See, U.S. patent application Ser. No. 08/641,513 filed on May 1, 1996 (now U.S. Pat. No. 5,881,042), Ser. No. 08/657,145 filed on Jun. 3, 1996 (now U.S. Pat. No. 6,270,696), and Ser. No. 08/846,916 filed on Apr. 29, 1997 (now U.S. Pat. No. 6,243,350). The dimensions of the solid immersion lens (e.g., the spacing between the spherical surface and the flat surface) and the position of the lens in the slider may significantly affect the optical performance and other properties of the resultant optical head. Hence, it is desirable to develop processing techniques and respective tools to precisely control the device parameters during the fabrication process.

SUMMARY

The devices and techniques of this disclosure allow for accurately placing elements, e.g., spheres, into the holes of a substrate in a batch process. One embodiment of the device includes a reference plate having a flat surface as a reference surface, a plurality of spacer balls disposed on the reference surface, a first weight plate, and a second weight plate. The spacer balls support a substrate to be processed and to define a spacing between the reference surface and the substrate. The first weight plate includes protruded contacts which extend into holes in the substrate to press elements respectively placed in the holes against the reference surface, without applying pressure on the substrate. The second weight plate is disposed above the reference plate to press the substrate against the spacer balls.

A positioning cage may be placed above the reference surface and below the substrate to define the positions of the elements. One embodiment of the positioning cage has two arrays of holes. The first array of positioning holes are smaller than the elements and respectively hold the elements in the positioning holes to contact the reference surface. The second array of spacer-ball holes have a diameter greater than that of the spacer balls so that the spacer balls can be placed in these holes. A plurality of supporting elements are disposed on the reference surface to support a rim of each spacer-ball hole. Each supporting element has a height less than the diameter of the spacer balls.

These and other aspects and associated advantages will become more apparent in light of the following detailed description, the accompanying drawings, and the appended claims.

DETAILED DESCRIPTION

The following description uses examples of placing multiple spheres into holes of a substrate to illustrate various embodiments of the processing techniques and tools. More specifically, the examples are for fabricating optical heads having solid immersion lenses made from spheres.

Figure 1:
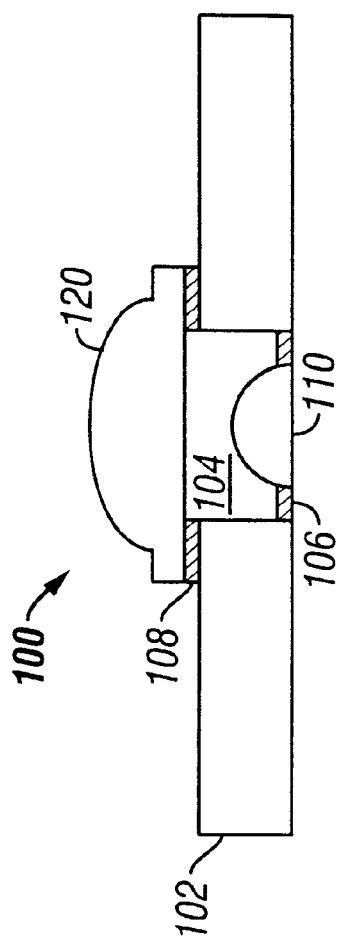
FIG. 1 shows one embodiment of an optical head formed on a substrate having an objective lens and a solid immersion lens with a spherical surface and a flat surface.

FIG. 1 shows one embodiment of an optical head 100. A substrate 102 has a through hole 104 for receiving a solid immersion lens 110 which has a spherical surface and a flat surface that opposes the spherical surface. The lens 110 may be a semispherical lens as shown. Bond joints 106 are used to fix the sides of the lens 110 to the side walls of the hole 104. Another lens 120 is attached to the substrate 102 by, e.g., bond joints 108 over the hole 104, to function as an objective lens. This objective lens 120 focuses an input optical beam to the lens 110. Lenses 110 and 120 define an optical path that is clear of joint bonds 106 or 108. The lens 110 may be used to couple optical energy to and from an optical storage medium. Such an optical head 100 may be used in a near-field optical configuration by evanescent coupling to achieve a high areal density, e.g., up to or higher than about ten gigabits per square inch. In the near-field configuration, the flat surface of the lens 110 is spaced from the storage medium by less than one wavelength of the optical beam to allow otherwise totally-reflected rays at the flat surface to be coupled through the air gap by evanescent fields.

Figure 2:
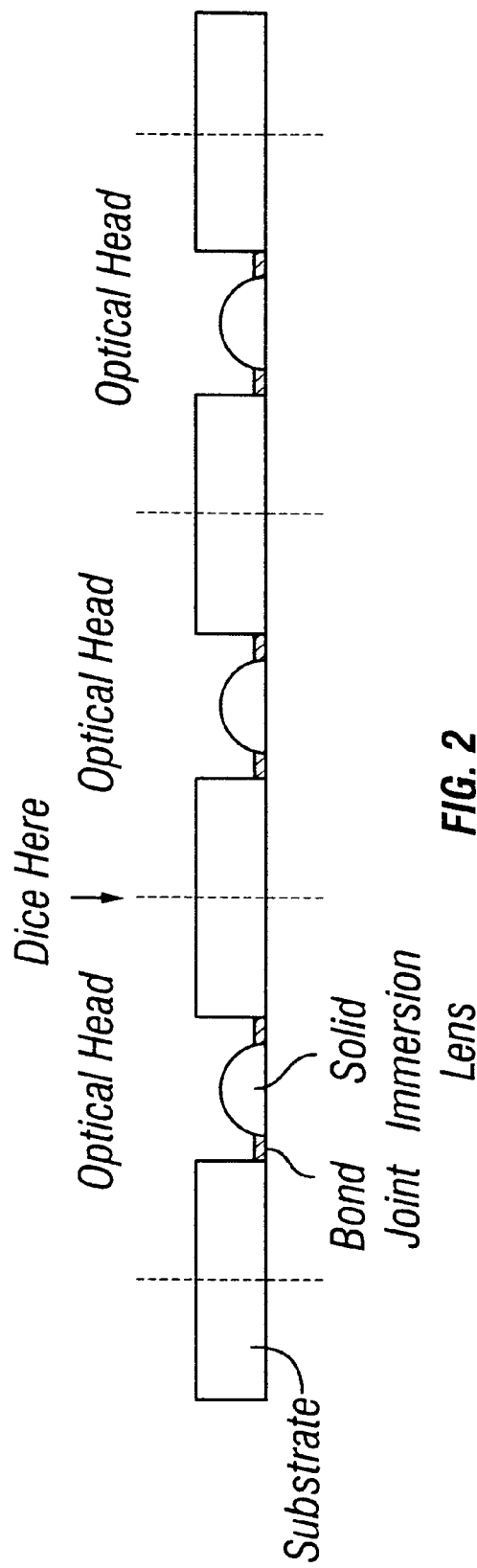
FIG. 2 shows a substrate that is processed to have solid immersion lenses bonded in an array of holes.

The optical head 100 may be manufactured in a batch process where multiple heads are simultaneously formed through the same sequence of processing operations from a single substrate. The substrate is prepared and processed to have an array of holes in one dimension or two dimensions. Multiple spheres are then placed and bonded into the holes with a desired amount of protrusion outside the holes. This defines the desired portion of the sphere that is inside each hole. Next, the protruded portion of each sphere is removed by lapping. The remaining portion of each sphere inside the hole has the desired dimension to form the lens 110. FIG. 2 shows multiple heads formed in a substrate (the objective lens is not shown). After the lenses 110 and other features and components are formed, the substrate is diced into individual heads.

One challenge in the batch process is to precisely place and bond each sphere in the hole 104 to form the lens 110. First, each lens 110 should have a predetermined spacing from the center of the spherical surface to the flat surface within a given tolerance range. The spacing may be equal to the radius of the sphere so that lens 110 is hemispherical, or may be greater than the radius but less than the diameter so that the lens 110 is super hemispherical. The flat surface should be substantially coplanar with the substrate surface. This requires inserting the desired amount of the sphere into the hole in the substrate. Second, the lens 110 should be positioned at or near the center of each hole 104 with an acceptable tolerance. Hence, it is desirable to accurately define the lateral position relative to the sidewalls of each hole.

In the example of hemispherical lenses, a lens 110 with a hemisphere of 1 mm in diameter may be required to have a positioning tolerance within 5 microns in all dimensions with respect to one surface of the wafer, i.e., an error tolerance less than about 0.5%. The flat surface of the lens 110 may be further required to be coplanar with the wafer surface within 1 microinch (about 25 nm). Special processing techniques and tools are disclosed here to achieve a processing precision that equals to or exceeds the above precision requirements.

Figure 3:
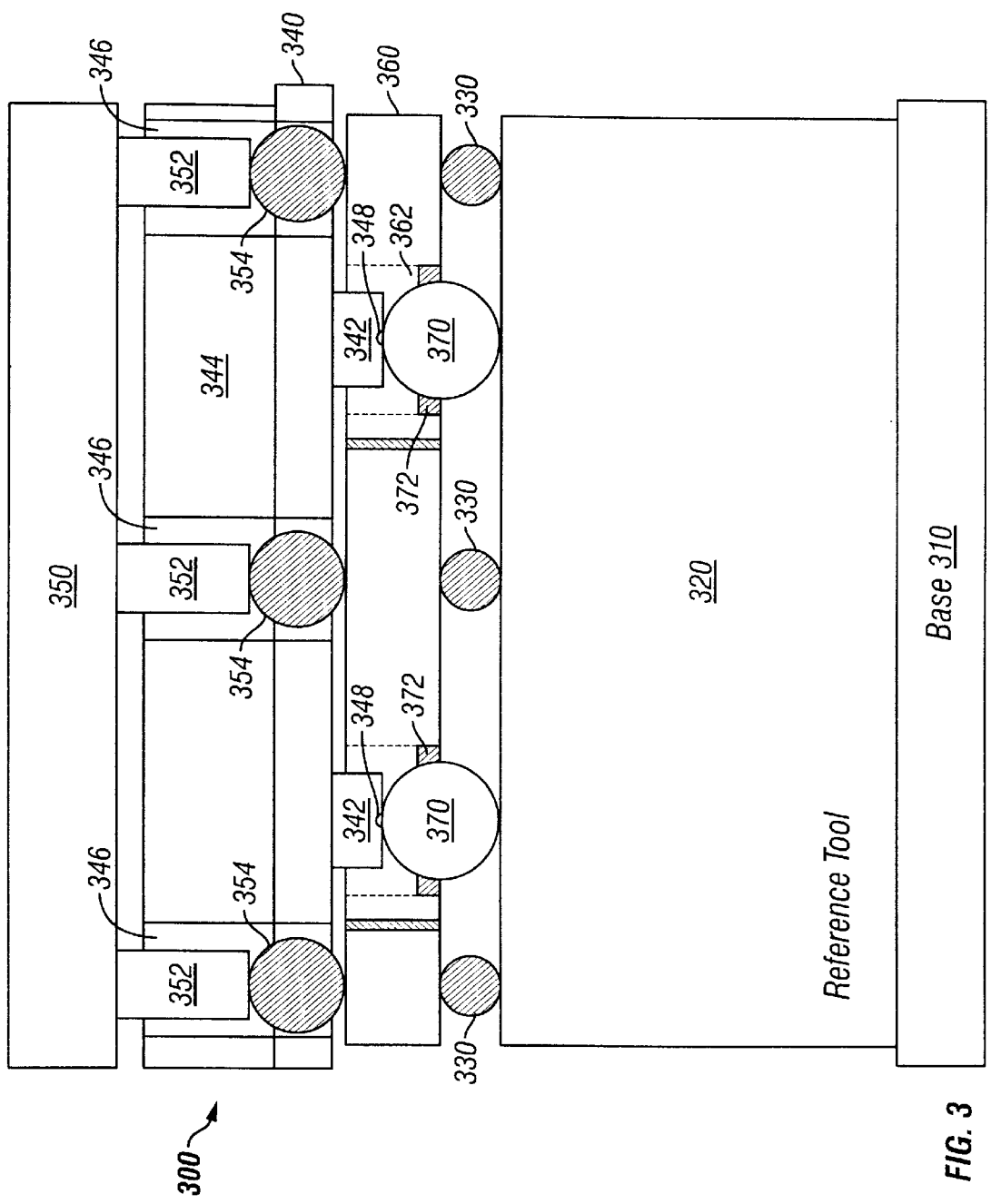
FIG. 3 shows one embodiment of a processing tool for positioning and bonding identical elements (e.g., spheres) into holes of a substrate.

FIG. 3 shows one processing tool 300 for positioning and bonding the spheres 370 into holes 362 in a substrate 360. The tool 300 has a support base. 310, a reference flat 320 supported by the support base 310, and multiple spacer balls 330 placed on the reference flat 320 to support the substrate 360. A first weight plate 340 having contacts 342 is positioned in contact with the spheres 370 to function as a pressure-applying element. It presses the spheres 370 against the reference flat 320. A weight unit. 344 is placed atop the first weight plate 340 to control the pressure generated by the first weight plate 340. The contacts 342 are sized to have a lateral dimension that fits into the holes 362 in order to reach the spheres 370 without touching the substrate 360. The coefficient of thermal expansion of the contacts 342 may be similar to or approximately the same as that of the spheres 370. In addition, the height of the contacts 342 are sufficiently large to allow a gap between the substrate 360 and the first weight plate 340 when contacts 342 are in contact with the spheres 370. Hence, the first weight plate 340 only applies pressure on the spheres 370, but not on the substrate 360.

The tool 300 also includes a second weight plate 350 having pins 352 and rigid balls 354 to apply pressure to the substrate 360 against the spacer balls 330. The rigid balls 354 may be formed from a rigid material such as glasses and ruby. Each pin 352 may have a flat or curved end surface to contact the apex of each sphere 354. The weight unit 344 and the first weight plate 340 have through holes sized to receive the pins 352 and balls 354 so that the first and second weight plates 340 and 350 are not mechanically coupled to each other. The diameter of each through hole in the first weight plate 340 is designed to be slightly bigger than the balls 354 to control the lateral position of each ball 354. In this configuration, the second weight plate 350 only presses the substrate 360. Therefore, the pressure on the substrate 360 and the pressure on the spheres 370 are independent with each other and can be independently controlled.

The reference flat 320 should be more rigid and thicker than the substrate 360 so that it deforms little under the pressure from the spacer balls 330 and the spheres 370. The material for the reference flat 320 may have similar or approximately the same coefficient of thermal expansion as that of the substrate 360 to keep the lateral shift below an acceptable level when temperature changes during fabrication. Hence, the reference flat 320 may be formed of the same material as the substrate 360, such as Frit glass SP 1702 by Speciality Glass, alumina, or other suitable materials. Alternatively, the reference flat 320 may be formed of a material different from the substrate 360 with approximately the same or similar coefficient of thermal expansion.

The positions of the pins 346 and the balls 354 are located over the positions of the spacer balls 330. The pressure from the second weight plate 350 on the substrate 360 is sufficient large to ensure the substrate 360 is firmly in contact with each spacer ball 330. Thus, when the substrate 360 has some degree of waviness, this pressure can deform the substrate 360 to contact the spacer balls 330 so that the spacing between the substrate 360 and the reference flat 320 is the diameter of the spacer ball 330 at each contact location. Since the first weight plate 340 presses the spheres 370 against the reference flat 320, the amount of protrusion of each sphere 370 outside the substrate 360 is determined by the spacing between the substrate 360 and the reference flat 320, which is substantially equal to the diameters of the spacer balls 330. Hence, for example, when it is desirable to place a hemisphere of the sphere 370 into the substrate 360, the diameter of the spacer balls 330 is set to be one half of the diameter of the spheres 370.

Therefore, the structure of the tool 300 converts the precision of placing a desired amount of the sphere 370 within the substrate 360 into the precision of the flatness of the reference flat 320 and the diameters of the spacer balls 330. The latter, however, can be controlled within the desired precision by known techniques. For example, the diameter of the spacer ball 330 can be made with a precision on the order of ±5 micro inch or better. Hence, the tool 300 substantially removes an operator from performing precision control of the tool 300. This simplifies the operator's operation and reduces the impact of an operator's error on the precision of the processed devices. Since the substrate 360 can be deformed under pressure to conform with the reference flat 320 at distributed locations of the spacer balls 330, the reference flat 320 need not be highly flat, e.g., no better than from about 25 $\mu$m to about 50 $\mu$m across a wafer of 3 inches in diameter. In addition, no parallelism control is needed to align the substrate 360 in parallel with the reference flat 320 and hence the complexity of the structure and cost of the tool 300 can be significantly reduced.

The use of spacer balls 330 to set the amount of insertion of the spheres 370 (or other elements) into the holes 362 of the substrate 360 has a number of advantages. For example, each spacer ball 330 essentially has a "point contact", i.e., a small contact area, with either the reference flat 320 or the substrate 360. This point contact can substantially avoid trapping any debris particles that may affect the precision of the amount of insertion. In addition, the point contact generates a high pressure at the contact point due to its small contact area that can squeeze out any debris particles that are accidently caught in the contact area.

In operation, the substrate 360 is prepared to have an array of through holes 362 and is placed over the spacer balls 330. Sphere lenses 370 are placed in the holes of the substrate 360. The first weight plate 340 is placed over the substrate 360 so that contacts 342 are placed over the sphere lenses 370 and press the spheres 370 against the reference flat 320. The second weight plate 350 is also positioned so that the rigid balls 354 press the substrate 360 against the spacer balls 330 on the reference flat 320. The horizontal position of each sphere lens 370 in the hole 362 may be defined by the hole 362 and a glass bond ring 372. In one implementation, each sphere 370 may be affixed to the glass ring 372 before being placed into each hole 362. A heating treatment is then performed to raise the temperature to or above the melting point of the glass bond ring 372 to bond the sphere 370 to the side walls of each hole 362.

Figure 4:
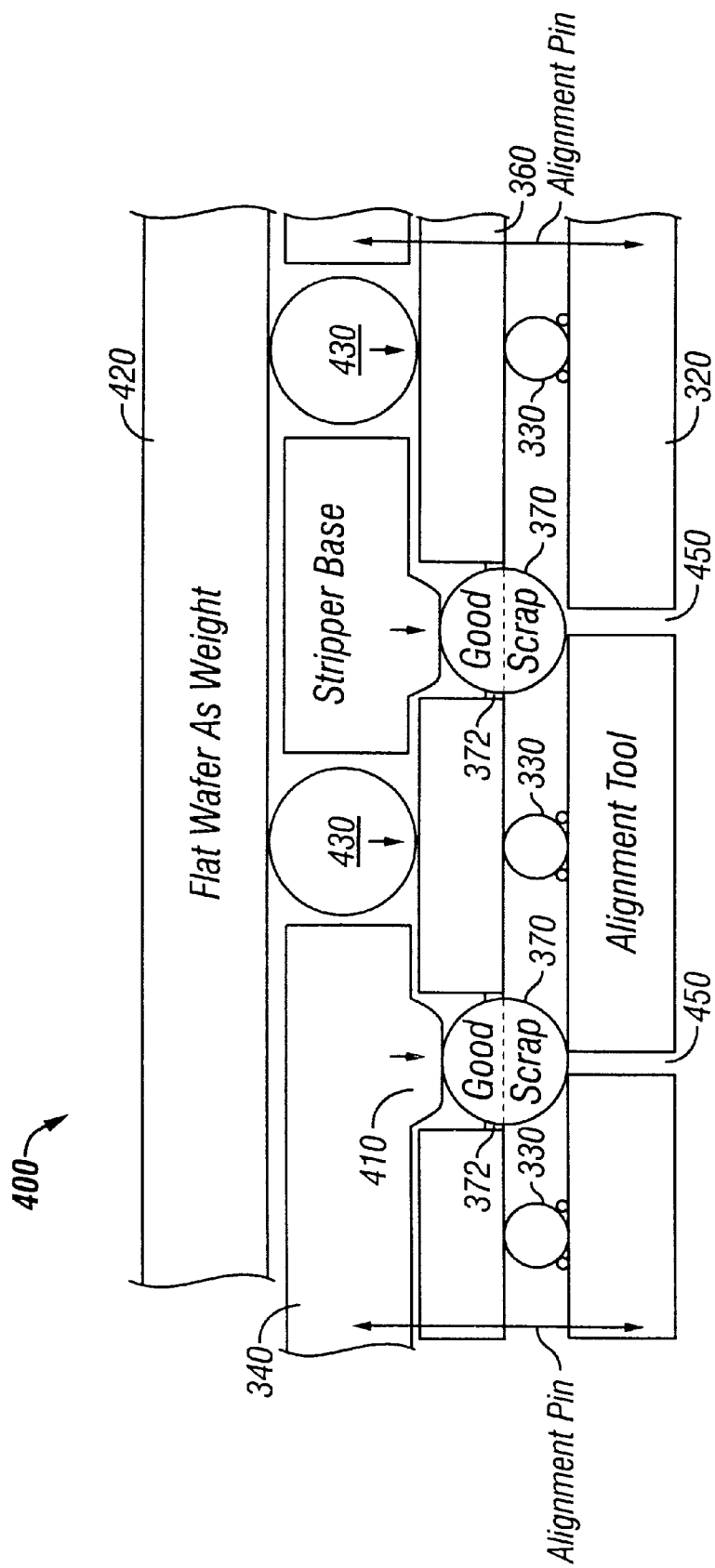
FIG. 4 shows another embodiment of a processing tool for positioning and bonding identical elements (e.g., spheres) into holes of a substrate.

FIG. 4 shows another modified tool 400 based on the tool 300 of FIG. 3. Contacts 410 on the first weight plate 340 for pressing the spheres 370 are integrated part of the plate 340. The second weight plate 420 does not have pins 352 as in the second weight plate 350 in FIG. 3. Rather, a large contact balls 430 are implemented to couple the pressure from the second weight plate 420 to the substrate 360. The diameter of the contact balls 430 is selected to allow a gap between the first and second weight plates. The diameter of through holes 346 in the first weight plate 340 is larger than the diameter of the contact balls 430 so that the first and second weight plates are not mechanically coupled to each other.

Figure 5:
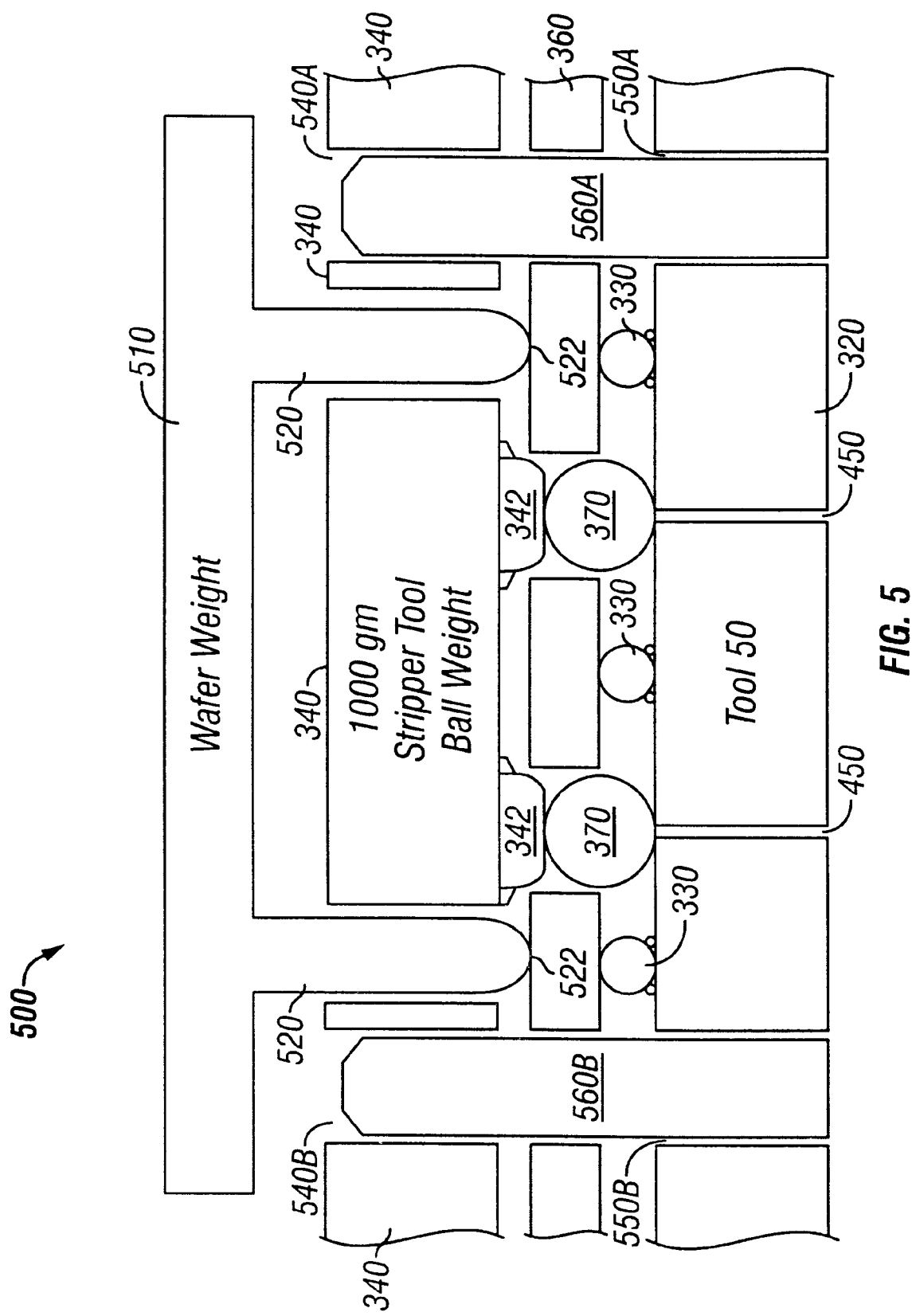
FIG. 5 shows yet another embodiment of a processing tool for positioning and bonding identical elements (e.g., spheres) into holes of a substrate.

FIG. 5 shows yet another modified tool 500. The second weight plate 510 has contact pins 520 that have spherical end surfaces 520 to press the substrate 360. Other shapes of the end surfaces may also be used to provide a "point contact" with the substrate 360. The reference plate 320 has at least two alignment posts 560A and 560B to approximately align the lateral positions of the first weight plate 340 and the substrate 360 relative to the reference flat 320. At least one pair of through holes, 540A and 540B, 550A and 550B, are formed at different locations in the first weight plate 340 and the substrate 360, respectively, to receive the alignment posts 560A and 560B.

The spacer balls 330 may be fixed to desired locations on the reference flat 320 by bonding. Alternatively, at 4 least three separate support points may be placed around a desired location to movably place a spacer ball 330. In addition, a grid frame may be used to position the spacer balls 330 at desired locations.

The lateral positions of the spheres 370 may be fixed in a number of ways. One way is to fix the spheres 370 with respect to the reference flat 320. This can be achieved by forming an array of nests on the reference flat at the desired locations for the spheres 370. Each nest is desired to allow that each sphere 370 be placed at the desired location and that each sphere 370 be in full contact with the reference flat 320. A nest can be a ring with its center at the desired location or at least three separate support points formed on a circuit centered at the desired location. A nest may also be a small hole formed in the reference flat 320 as shown by the numeral 450 of FIG. 4, where the actual amount of insertion of the spheres 370 must take account of the amount of the spheres 370 sinks into the nest of the small hole.

Another way to laterally fix the spheres 370 uses the substrate 360 or the first weight plate 340 that presses the spheres 370 against the reference flat 320. One implementation uses an indent 348 in each contact 342 of the first weight plate 340. Another implementation uses a ring formed of a bonding material, which attaches each sphere 370 to the side walls of the through hole in the substrate 360, to approximately define the lateral position of each sphere 370 with respect to the substrate 360. Such a ring may first be bonded to the side walls of each hole. The inner diameter of the bonding ring may initially be small to position each sphere 370 in each hole. Then the bonding ring is heated to a molten state while pressing the substrate 360 against the spacer balls 330. This operation places the desired amount of spheres 370 into the holes of the substrate 360 by enlarging the inner diameter of the bonding ring. The bonding ring is then cooled to the ambient temperature so that the spheres 370 are bonded to the substrate 360.

Figure 6:
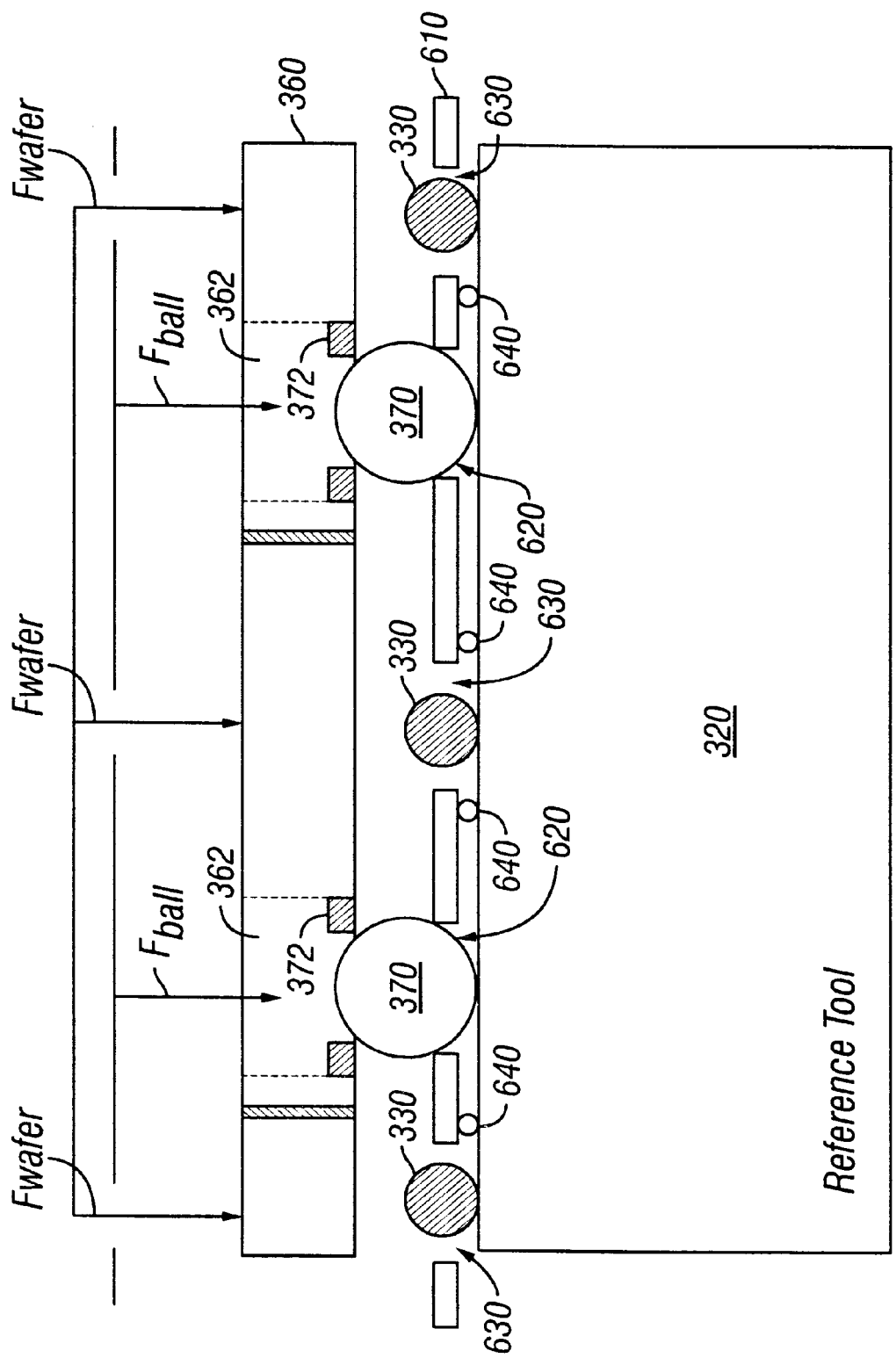
FIG. 6 shows one embodiment of a processing tool for positioning and bonding identical elements (e.g., spheres) into holes of a substrate by implementing a positioning cage to control the lateral positions of the spherical elements.

A compliant positioning cage can also be used to position the sphere lenses 370. FIG. 6 shows one embodiment of a bonding tool 600 having such a compliant positioning cage 610. The compliant positioning cage 610 may be formed of a relatively thin sheet to be compliant. The thickness of the sheet is less than the diameter of the spacer balls 330. The thermal expansion coefficient of the cage 610 may be approximately equal to that of the substrate 360. Two arrays of through holes are formed in the thin sheet to form the positioning cage 610: a first array of holes 620 for holding and positioning the sphere lenses 370 and a second array of holes 630 for placing the spacer balls 330. The holes 620 and 630 are spatially interleaved as shown. The diameter of the holes 620 is smaller than the diameter of the sphere lenses 370. The diameter of the holes 630 are generally greater than that of the spacer balls 330.

The positioning cage 610 is placed over the top surface of the reference flat 320 and is elevated therefrom by small supporting elements 640. The supporting elements 640 may be small spheres that are smaller than the spacer balls 330. At least two supporting elements 640 are positioned around or near the rim of each hole 630. The rims of the holes 620 are not supported so that the rim of each hole 620 can pivot under pressure with respect to a supporting element 640 of an adjacent hole 630. The material of the cage 610 is compliant so that when pressure is applied to a sphere lens 370 in a hole 620, the area around the hole 620 is bent towards the top surface of the reference flat 320. The holes 630 are larger than the spacer balls 330 to allow the flexing movement of the cage 610 around the support elements 640 near the spacer balls 330. This mechanism ensures contact between the sphere lenses 370 and the reference flat 320 while still maintaining the positions of the sphere lenses 370 as defined by the holes 620 of the cage 610.

The support elements 640 may be elastically deformable under pressure to further facilitate the contact between the sphere lenses 370 and the reference flat 320 through the holes 620 of the cage 610. The support elements 640 may be hollow spheres formed of a deformable material such as alumina. Other shapes may also be used.

In one implementation, the compliant cage 610 is formed of a thin alumina sheet with a precision arrays of holes 620 and 630. The holes 620 and 630 are precisely formed by a suitable processing technique. Photo lithographic patterning with reactive-ion etching or single-point diamond machining may be used.

The compliant positioning cage 610 can reduce the precision on the hole location and size in the substrate 360 by providing precision control in the tool 600. Hence, it becomes economically feasible to use different relatively inexpensive and fast methods for hole fabrication in the substrate 360 without trading off the overall fabrication precision. This can reduce the overall cost and improve the throughput.

The diameter of the holes 620 in the compliant positioning cage 610 is smaller than the diameter of the sphere lenses 370. Thus, when the sphere lenses 370 are in full contact with the rims of holes 620 to touch the reference flat 320, the positions of the holes 620 essentially define and control the lateral positions of the lenses 370. In comparison with other techniques for controlling the lateral positions of the lenses 370, the use of compliant positioning cage 610 can substantially reduce the position errors that may be caused by the clearance between the holes 362 and the lenses 370 and any mismatch in the coefficients of thermal expansion between the lenses 370 and the wafer 360.

The above tools shown in FIGS. 3–6 may be used to fabricate the optical head shown in FIG. 1 in the following process. First, a wafer substrate of a suitable material such as alumina ceramic (a form of aluminum oxide) or zirconia is prepared. The wafer substrate can sustain the melting temperature above 500° C. Then, an array of through holes are formed in the substrate, e.g., by laser processing. Glass bond in form of a ring is formed in each hole. The glass bond ring may be formed of Frit glass (e.g., CF7555 from Ferro Corp.) which melts at about 450° C.

Next, a spherical lens is placed into each hole at a desired position and is in contact with the glass bond ring. The temperature of glass bond rings are raised to or above 450° C. to melt and bond the spheres to the side walls of the holes, e.g., placing the lens 120 on each head. The portion of each sphere protruding out of the substrate surface is lapped off to form the flat surface that is substantially coplanar with the substrate surface (i.e., flushed with the substrate surface). Other processing steps are subsequently performed to form the heads.

Although a few embodiments have been described, various modifications and enhancements may be possible without departing from the following claims.

What is claimed is:

1. A device for placing elements into holes in a substrate, comprising:
   a reference plate having a flat surface as a reference surface;
   a plurality of spacer elements disposed on said reference surface to support a substrate and to define a spacing between said reference surface and the substrate;
   a first plate having protruded contacts which extend into holes in the substrate to press elements respectively placed in the holes against said reference surface, without applying pressure on the substrate; and
   a second plate disposed above said reference plate to press the substrate against said spacer elements on said reference surface.

2. A device as in claim 1, wherein said first plate has a plurality of through holes positioned above said spacer elements, and said device further comprising a plurality of rigid balls sized smaller than said through holes, said rigid balls disposed on the substrate over said spacer elements and positioned in said through holes of said first plate, wherein said second plate is coupled to press said rigid balls against the substrate.

3. A device as in claim 2, wherein said second plate has a plurality of pins that respectively extend into said through holes, without touching said first plate, to press said rigid balls.

4. A device as in claim 2, wherein each pin of said second plate has a flat surface which contacts and presses a respective rigid ball.

5. A device as in claim 1, wherein said first plate has a plurality of through holes positioned above said spacer elements, and wherein said second plate has a plurality of pins that respectively extend into said through holes, without touching said first plate, to press the substrate.

6. A device as in claim 5, wherein each pin of said second plate has a curved surface which contacts and presses the substrate against said spacer elements.

7. A device as in claim 1, wherein each contact of said first plate has a flat surface that contacts and presses a respective element against said reference surface.

8. A device as in claim 7, wherein said flat surface in each contact of said first plate includes a dent to define a lateral position of the element on said reference surface.

9. A device as in claim 7, wherein said reference surface of said reference plate has a plurality of positioning units that respectively determine positions of the elements.

10. A device as in claim 9, wherein each positioning unit includes an opening in said reference surface.

11. A device as in claim 1, wherein said contacts of said first plate have a coefficient of thermal expansion that is approximately equal to a coefficient of thermal expansion of the elements.

12. A device as in claim 1, wherein said reference plate has a coefficient of thermal expansion that is approximately equal to a coefficient of thermal expansion of the substrate.

13. A device as in claim 1, further comprising:
   a positioning cage placed above said reference surface and below the substrate, said positioning cage having a first array of positioning holes of a size less than a size of the elements and operating to respectively hold the elements in said positioning holes to contact said reference surface, and a second array of spacer holes of a size greater than said spacer elements through which said spacer elements are placed; and
   a plurality of supporting elements disposed on said reference surface to support a rim of each spacer hole, each supporting element having a height less than a height of said spacer elements.

14. A device as in claim 13, wherein said supporting elements are deformable under pressure.

15. A device as in claim 13, wherein said positioning cage is deformable under pressure.

16. A device for placing elements into holes in a substrate, comprising:
   a reference plate having a flat surface as a reference surface;
   a plurality of spacer elements substantially identical to one another and disposed on said reference surface to support a substrate with holes for placing the elements; and
   a pressure-applying element to press the substrate against the spacer elements towards said reference surface to define a spacing between said reference surface and the substrate and hence an amount of a portion of each of the elements protruded out of the holes of the substrate.

17. The device as in claim 16, further comprising:
   a positioning cage positioned between said reference surface and said pressure-applying element and placed below the substrate, said positioning cage having a first array of positioning holes of a size less than a size of the elements to respectively hold the elements in said positioning holes to contact said reference surface, and a second array of spacer holes of a size greater than said spacer elements through which said spacer elements are placed between reference surface and the substrate; and
   a plurality of supporting elements disposed on said reference surface to support a rim of each spacer hole, each supporting element having a height less than a height of said spacer elements.

18. The device as in claim 17, wherein said supporting elements are formed of a deformable material.

19. The device as in claim 17, wherein said positioning cage are formed of a compliant material.

20. The device as in claim 17, wherein each support element is a rigid sphere.

21. The device as in claim 13, wherein said positioning cage are compliant.

* * * * *